(12) United States Patent
Fukano

(10) Patent No.: US 9,882,540 B2
(45) Date of Patent: *Jan. 30, 2018

(54) METHOD FOR MANUFACTURING SURFACE ACOUSTIC WAVE APPARATUS

(71) Applicant: KYOCERA Corporation, Kyoto-Shi, Kyoto (JP)

(72) Inventor: Toru Fukano, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 26 days.

This patent is subject to a terminal disclaimer.

(21) Appl. No.: 14/704,716

(22) Filed: May 5, 2015

(65) Prior Publication Data

US 2015/0236665 A1    Aug. 20, 2015

Related U.S. Application Data

(63) Continuation of application No. 12/376,546, filed as application No. PCT/JP2007/065435 on Aug. 7, 2007, now Pat. No. 9,021,669.

(30) Foreign Application Priority Data

Aug. 7, 2006 (JP) .................. 2006-214162

(51) Int. Cl.
   *H03H 3/08*     (2006.01)
   *H03H 9/10*     (2006.01)
   (Continued)

(52) U.S. Cl.
   CPC .............. *H03H 3/08* (2013.01); *H01L 41/23* (2013.01); *H01L 41/27* (2013.01); *H03H 3/007* (2013.01);
   (Continued)

(58) Field of Classification Search
   CPC .. H03H 3/007; H03H 3/08; H03H 2003/0071; H03H 9/008; H03H 9/0576;
   (Continued)

(56) References Cited

U.S. PATENT DOCUMENTS

4,256,816 A    3/1981   Dunkleberger
5,390,401 A *   2/1995   Shikata .................... H03H 3/08
                                                                                             29/25.35
(Continued)

FOREIGN PATENT DOCUMENTS

EP        0794616 A2    9/1997
JP        57118419 A    7/1982
(Continued)

OTHER PUBLICATIONS

Office Action dated Jul. 28, 2015, issued in counterpart Japanese application No. 2014-090968.
(Continued)

*Primary Examiner* — A. Dexter Tugbang
(74) *Attorney, Agent, or Firm* — Procorpio Cory Hargreaves and Savitch LLP

(57) ABSTRACT

Provided is a method for manufacturing a surface acoustic wave apparatus that can reduce degradation of electric characteristics and also reduce the number of manufacturing processes. The method for manufacturing a surface acoustic wave apparatus includes the steps of: forming an IDT electrode on an upper surface of a piezoelectric substrate, forming a frame member surrounding a formation area in which the IDT electrode is formed on the piezoelectric substrate, and mounting a film-shaped lid member on the upper surface of the frame member so as to be joined to the frame member so that a protective cover, used for covering the formation area and for providing a tightly-closed space between it and the formation area, is formed.

17 Claims, 9 Drawing Sheets

(51) Int. Cl.
*H01L 41/23* (2013.01)
*H03H 3/007* (2006.01)
*H03H 9/05* (2006.01)
*H03H 9/145* (2006.01)
*H01L 41/27* (2013.01)
*H05K 3/34* (2006.01)
*H05K 1/14* (2006.01)
*H03H 9/00* (2006.01)

(52) U.S. Cl.
CPC ............ *H03H 9/008* (2013.01); *H03H 9/059* (2013.01); *H03H 9/0576* (2013.01); *H03H 9/1071* (2013.01); *H03H 9/1092* (2013.01); *H03H 9/14582* (2013.01); *H05K 1/144* (2013.01); *H05K 3/3426* (2013.01); *H01L 2224/11* (2013.01); *H01L 2924/16235* (2013.01); *H03H 2003/0071* (2013.01); *Y10T 29/42* (2015.01); *Y10T 29/49005* (2015.01); *Y10T 29/49144* (2015.01); *Y10T 29/49155* (2015.01)

(58) Field of Classification Search
CPC .. H03H 9/059; H03H 9/1092; H03H 9/14582; H03H 9/1071; H01L 41/23; H01L 41/27; H01L 2224/11; H01L 2924/16235; H05K 1/144; H05K 3/3426; Y10T 29/42; Y10T 29/49005; Y10T 29/49144; Y10T 29/49155
See application file for complete search history.

(56) References Cited

U.S. PATENT DOCUMENTS

| | | | |
|---|---|---|---|
| 5,421,081 A | 6/1995 | Sakaguchi et al. | |
| 5,920,142 A | 7/1999 | Onishi et al. | |
| 6,413,404 B1 | 7/2002 | Iharu et al. | |
| 6,424,075 B1 | 7/2002 | Inoue et al. | |
| 2005/0285475 A1 | 12/2005 | Yokota et al. | |
| 2006/0192462 A1 | 8/2006 | Iwamoto et al. | |
| 2008/0007370 A1 | 1/2008 | Matsumoto | |

FOREIGN PATENT DOCUMENTS

| | | | |
|---|---|---|---|
| JP | 07303023 A | 11/1995 | |
| JP | 09-172339 | 6/1997 | |
| JP | 10-112624 | 4/1998 | |
| JP | 10-270975 | 10/1998 | |
| JP | 10-275811 | 10/1998 | |
| JP | 11150441 A | 6/1999 | |
| JP | 11233691 A | 8/1999 | |
| JP | 2000261284 A | 9/2000 | |
| JP | 2001244786 A | 9/2001 | |
| JP | 2001308546 A | 11/2001 | |
| JP | 2002261582 A | 9/2002 | |
| JP | 2004-096255 A | 3/2004 | |
| JP | 2004-274574 A | 9/2004 | |
| JP | 2004-282707 | 10/2004 | |
| JP | 2005-38980 | 2/2005 | |
| JP | 2005033689 A | 2/2005 | |
| JP | 2005085898 A | 3/2005 | |
| JP | 2005-252335 A | 9/2005 | |
| JP | 2005295363 A | 10/2005 | |
| JP | 2005085898 A | 4/2006 | |
| JP | 2006179972 A | 7/2006 | |
| JP | 2006-203788 A | 8/2006 | |
| JP | 2007081613 A | * | 3/2007 |
| JP | 2008124784 A | * | 5/2008 |
| WO | 2004/021398 A2 | 3/2004 | |
| WO | 2005101657 A1 | 10/2005 | |
| WO | 2006006343 A1 | 1/2006 | |

OTHER PUBLICATIONS

Office Action dated Apr. 21, 2015 issued in counterpart Japanese application No. 2013-243560.
Japanese language office action dated Oct. 8, 2013 and its English language Statement of Relevance of Non-English References Pursuant to 37 CFR 1.98(a)(3)(i).
Office action dated Jul. 16, 2013 issued in corresponding Japanese application No. 2013-091140.
Japanese language office action dated Jan. 28, 2014 and its English language Statement of Relevance of Non-English References Pursuant to 37 CFR 1__ 98(a)(3)(i).
Office action dated Sep. 25, 2012 issued in corresponding Japanese application 2008-528827.
Office action dated Nov. 2, 2010 issued in corresponding Chinese application 200780029421.5.
Office action dated May 15, 2012 issued in corresponding Japanese application 2008-528827.
Office action dated Aug. 2011 issued in corresponding Chinese application 200780029421.5.

* cited by examiner

FIG. 3
(a) 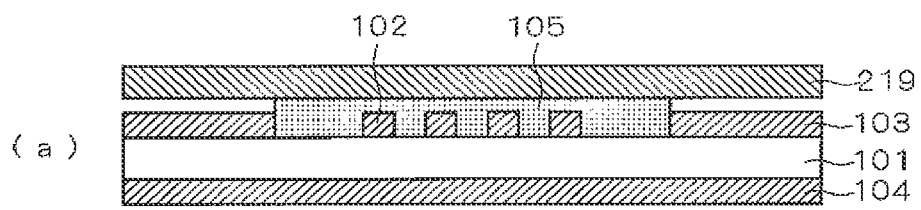
(b) 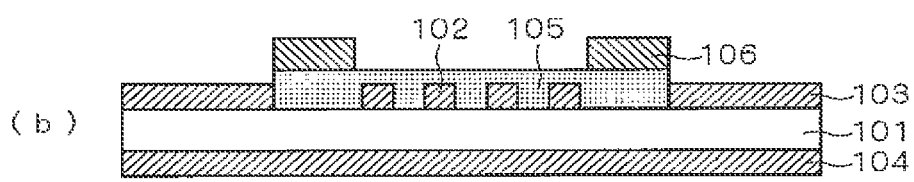

FIG. 5
(a) 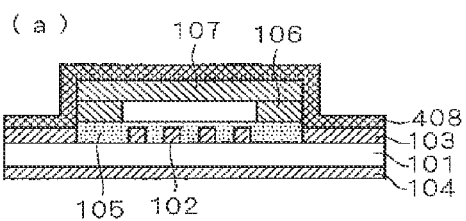
(b) 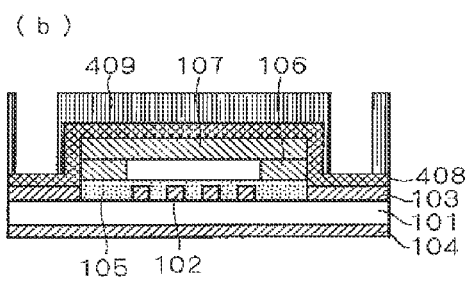
(c) 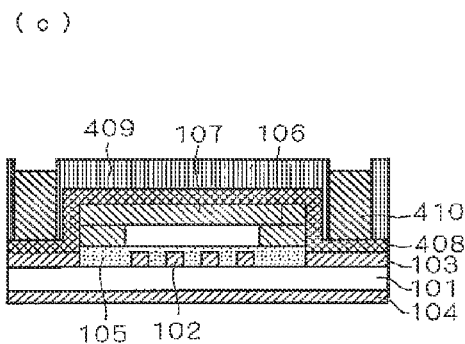
(d) 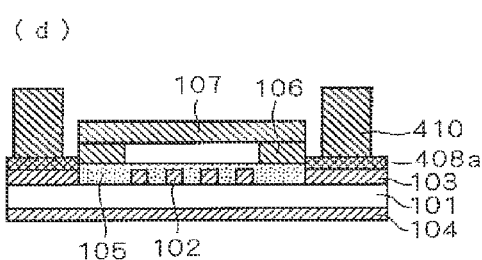
(e) 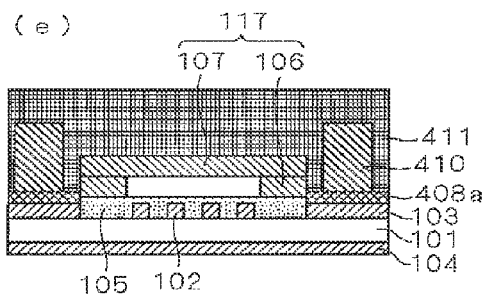
(f) 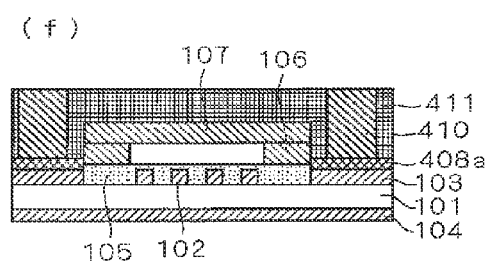
(g) 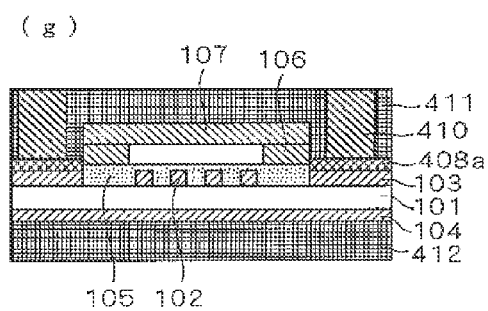
(h) 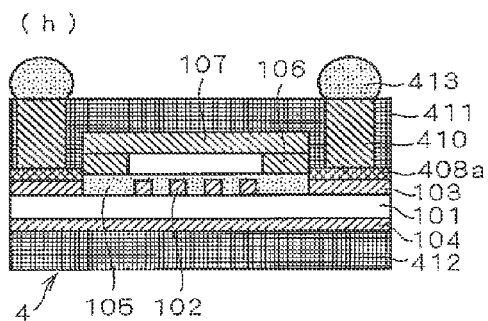

F I G . 8
(a)
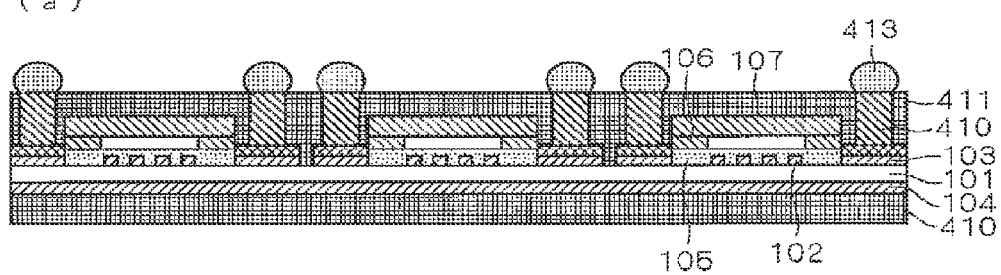
(b)
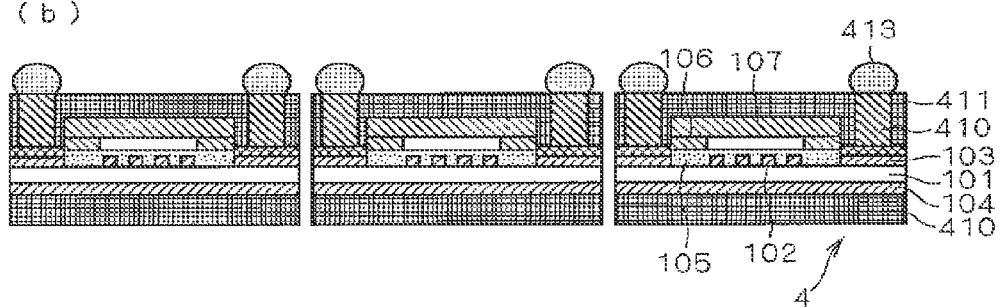

FIG. 9
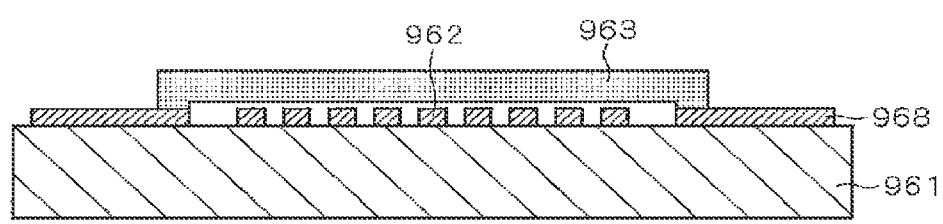
(a)
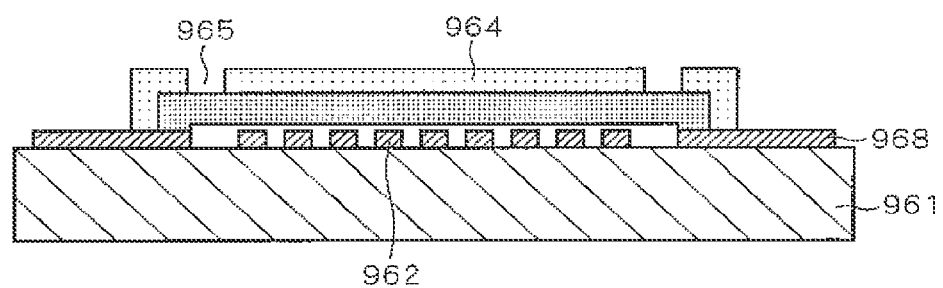
(b)
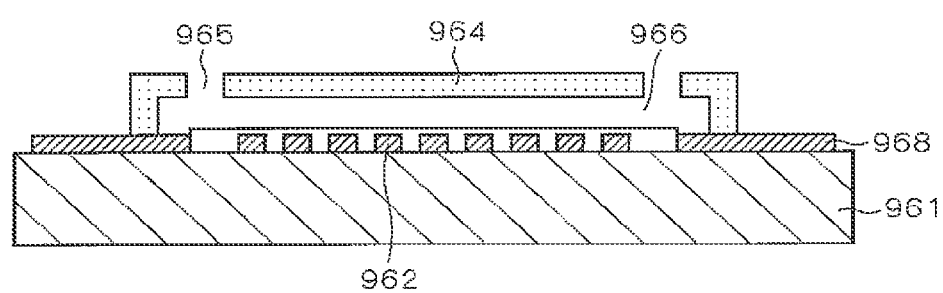
(c)

METHOD FOR MANUFACTURING SURFACE ACOUSTIC WAVE APPARATUS

CROSS-REFERENCING

The present application is a Continuation of U.S. application Ser. No. 12/376,546, filed on Oct. 19, 2009 which claims the benefit of PCT Application Number PCT/JP2007/065435 filed on Aug. 7, 2007, which claims the benefit of Japanese Application Number 2006-214162, filed on Aug. 7, 2006. The contents of each of the above applications are incorporated by reference herein in their entirety.

TECHNICAL FIELD

The present invention relates to a method for manufacturing a surface acoustic wave apparatus mainly used for a radio communication circuit of a mobile communication apparatus or the like and, more specifically, to a method for manufacturing a surface acoustic wave apparatus by which a surface acoustic wave apparatus capable of being surface-packaged can be miniaturized and can be formed into a packaged state by using wafer processes.

BACKGROUND ART

In recent years, with respect to portable terminal devices used for mobile communication, small-size and light-weight devices have been developed, and in order to achieve devices having multiple bands required for a plurality of communication systems and portable terminal devices with multiple functions, the number of built-in circuits has been increased. For this reason, in order to improve packaging density, there have been strong demands for miniaturizing the electronic parts to be used therein into small-size parts capable of being surface-packaged.

Here, surface acoustic wave apparatuses have been used as key parts for the portable terminal apparatus. In the surface acoustic wave apparatus, it is necessary to form a hollow portion near the electrode face on which surface acoustic waves are excited so as to ensure a vibration space, and also to air-tightly seal the vibration space. For this reason, the surface acoustic wave apparatus is housed, for example, in a ceramic package. With respect to this surface acoustic wave apparatus also, there have been strong demands for a small-size surface acoustic wave apparatus capable of being surface-packaged, which is low-loss, and has a superior blocking characteristic against frequencies outside the passband.

In response to this demand for small sizes, a surface acoustic wave apparatus having a WLP (Wafer Level Package)-type surface packaging structure has been proposed (for example, see JP-A 9-172339 and Japanese Patent Application National Publication (Laid-Open) No. 2005-537661).

FIG. 9 is a view describing a conventional method for manufacturing a surface acoustic wave apparatus. In the conventional method for manufacturing a surface acoustic wave apparatus, first, as shown in FIG. 9(a), a sacrifice layer 963, made from polysilicon, amorphous silicon or the like, is formed so as to cover a surface of an electrode pattern 962 of a surface acoustic wave element formed on a piezoelectric substrate 961, with at least one portion of an electrode pad 968 connected to the electrode pattern 962 being exposed. Next, as shown in FIG. 9(b), after a protective cover 964 has been formed so as to cover the sacrifice layer 963, a through hole 965 is formed through the protective cover 964 so as to allow the inner sacrifice layer 963 to be exposed. Next, as shown in FIG. 9(c), the sacrifice layer 963 is removed through the through hole 965, by using a dry etching method or the like, so that a hollow portion 966 is formed above the electrode pattern 962; thus, a surface acoustic wave apparatus is obtained.

However, as shown in FIG. 9, in the case where the protective cover 964 is formed by using the sacrifice layer 963, a problem arises upon removing the sacrifice layer 963 in which electric characteristics of the surface acoustic wave apparatus deteriorate due to etchant and etching products remaining in the hollow portion 966.

Moreover, many processes are required in the manufacturing process for forming the hollow portion 966, resulting in a problem of complex manufacturing processes.

DISCLOSURE OF THE INVENTION

The present invention has been devised to solve the above-mentioned problems, and an object thereof is to provide a method for manufacturing a surface acoustic wave apparatus that can reduce degradation of electric characteristics by providing a hollow portion without using a sacrifice layer. Moreover, its objective is also to provide a method for manufacturing a surface acoustic wave apparatus that can reduce the number of processes used for forming the hollow portion.

In order to solve the above-mentioned problems, a method for manufacturing a surface acoustic wave apparatus in accordance with a first aspect of the present invention comprises the steps of: a) forming an interdigital transducer (IDT) electrode on an upper surface of a piezoelectric substrate; b) forming a frame member surrounding a formation area in which the IDT electrode is formed on the piezoelectric substrate; and c) forming a protective cover which consists of said frame member and a lid that covers said formation area and composes inner wall of tightly-closed space by connecting film lid on said frame member.

In accordance with the first aspect, since a tightly-closed space can be formed between the formation area and the protective cover, without using a sacrifice layer, it is possible to manufacture a surface acoustic wave apparatus that can reduce degradation of electric characteristics.

Moreover, since the tightly-closed space can be formed between the first area and the protective cover without using the sacrifice layer, it is possible to reduce the number of processes for forming the tightly-closed space, and consequently to improve the productivity.

A method for manufacturing a surface acoustic wave apparatus in accordance with a second aspect is the method for manufacturing a surface acoustic wave apparatus in accordance with the first aspect, wherein said step b) includes the steps of b-1) mounting a first film on the piezoelectric substrate; and b-2) forming said frame member by curing said first film after patterning said first film by a photolithography method.

In accordance with the second aspect, since a frame member having an uniform thickness can be formed by only mounting the first film, the lid member can be mounted on the upper surface of the frame member without any gap. For this reason, it is possible to positively seal the tightly-closed space on a surface acoustic wave element area by using a simple process.

A method for manufacturing a surface acoustic wave apparatus in accordance with a third aspect is the method for manufacturing a surface acoustic wave apparatus in accordance with the second aspect, wherein said frame member and said lid member are made of the same material.

In accordance with the third aspect, upon joining the frame member and the lid member to each other, the two members can be formed into a protective cover as an integral unit made from the same material. With this arrangement, the adhesive strength of the two members and the air-tight property of the protective cover can be improved so that it is possible to manufacture a surface acoustic wave apparatus having high reliability.

A method for manufacturing a surface acoustic wave apparatus in accordance with a fourth aspect is the method for manufacturing a surface acoustic wave apparatus in accordance with the first aspect, wherein said step c) includes the steps of c-1) mounting a second film including a resin layer and a holding layer having a higher Young's modulus than that of said resin layer on an upper surface of the frame member with said holding layer being placed on the upper side; c-2) forming said lid member by curing said second film after patterning said second film by a photolithography method; and c-3) removing said holding layer of said second film after jointing said frame member and said lid member together.

In accordance with the fourth aspect, since the holding layer holds the resin layer, it is possible to suppress the entire second film from being deformed, and consequently to positively form the tightly-closed space.

A method for manufacturing a surface acoustic wave apparatus in accordance with a fifth aspect is the method for manufacturing a surface acoustic wave apparatus in accordance with the first aspect, further comprising the step of: d) forming a protective film covering said IDT electrode and made of an insulating material after said step a) and before said step b), wherein said frame member is formed on an upper surface of said protective film in said step b).

In accordance with the fifth aspect, it is possible to improve the adhesion of the frame member to its formation face, and consequently to improve the reliability of the surface acoustic wave apparatus.

A method for manufacturing a surface acoustic wave apparatus in accordance with a sixth aspect is the method for manufacturing a surface acoustic wave apparatus in accordance with the first aspect, wherein said surface acoustic wave apparatus further includes a connection line connecting the IDT electrode to an external circuit, and one portion of said connection line is extended outside said frame member.

In accordance with the sixth aspect, the position of the connection line can be freely determined depending on the external circuit, with the tightly-closed space being sealed. For this reason, it is possible to manufacture a surface acoustic wave apparatus that is superior in general-purpose utility.

A method for manufacturing a surface acoustic wave apparatus in accordance with a seventh aspect is the method for manufacturing a surface acoustic wave apparatus in accordance with the sixth aspect, further comprising the steps of: e) forming a plating base layer that covers said piezoelectric substrate having a sheet of wafer shape on which said protective cover has been formed; f) forming a plating resist film having an opening section on said connection line located outside said protective cover on said plating base layer; g) forming a pillar-shaped electrode on said plating base layer exposed to a bottom of said opening section by using a plating method; h) removing said plating resist film and said plating base layer, with said pillar-shaped electrode being left; i) forming a sealing resin film covering said protective cover and the pillar-shaped electrode on said piezoelectric substrate; and j) exposing said pillar-shaped electrode by grinding an upper surface of the sealing resin film. Moreover, after the step j), a step k) may further be prepared in which an external connection electrode is formed on the upper surface of the pillar-shaped electrode.

In accordance with the seventh aspect, it is possible to provide a surface acoustic wave apparatus capable of being surface-packaged. Moreover, since the surface acoustic wave apparatus can be manufactured on a wafer basis, it is possible to provide a surface acoustic wave apparatus without the necessity of complicated processes.

A method for manufacturing a surface acoustic wave apparatus in accordance with an eighth aspect is the method for manufacturing a surface acoustic wave apparatus in accordance with the seventh aspect, further comprising the steps of: l) forming a protective layer made from a material having virtually the same thermal expansion coefficient as that of said sealing resin film on a lower surface of said piezoelectric substrate.

In accordance with the eighth aspect, the impact resistant property of the surface acoustic wave apparatus during the manufacturing process and after the manufacturing process can be improved. For this reason, it becomes possible to suppress occurrence of defects, such as cracking and chipping, in the surface acoustic wave apparatus, to improve the yield, and consequently to improve the reliability of the surface acoustic wave apparatus.

A method for manufacturing a surface acoustic wave apparatus in accordance with a ninth aspect is the method for manufacturing a surface acoustic wave apparatus in accordance with the seventh aspect, wherein after said step j), the height of the uppermost portion of said pillar-shaped electrode is made higher than the height of the uppermost portion of said protective cover.

In accordance with the ninth aspect, the air-tight property of the protective cover can be sufficiently maintained.

A method for manufacturing a surface acoustic wave apparatus in accordance with a tenth aspect is the method for manufacturing a surface acoustic wave apparatus in accordance with the seventh aspect, wherein in said step f), said plating resist film is formed by repeating coating and curing processes of a resist material a plurality of times.

In accordance with the tenth aspect, since a plating resist having a desired thickness can be formed by using a resist material adjusted by taking its coating property, handling property and the like into consideration, the productivity can be improved. Moreover, the plating resist can be formed with a desired thickness so that a pillar-shaped electrode having a desired height can be formed.

A method for manufacturing a surface acoustic wave apparatus in accordance with an eleventh aspect is the method for manufacturing a surface acoustic wave apparatus in accordance with the sixth aspect, wherein, said surface acoustic wave apparatus comprises a plurality of said IDT electrodes and further comprises a plurality of conductor patterns connected to the IDT electrodes, wherein each of said conductor patterns includes a first conductor pattern, an insulating layer, and a second conductor pattern that intersects with said first conductor pattern, with said insulating layer being interposed therebetween.

In accordance with the eleventh aspect, since the IDT formation area formed on the piezoelectric substrate can be made compact in size, and in an assembling mode, a further compact surface acoustic wave apparatus can be provided.

A method for manufacturing a surface acoustic wave apparatus in accordance with a twelfth aspect is the method for manufacturing a surface acoustic wave apparatus in accordance with the eleventh aspect, wherein said insulating layer is made of silicon oxide or a polyimide resin.

In accordance with the twelfth aspect, it becomes possible to easily form a film having a thickness of several .mu.m as the insulating layer, and also to carry out processing operations with high precision.

A method for manufacturing a surface acoustic wave apparatus in accordance with a thirteenth aspect is the method for manufacturing a surface acoustic wave apparatus in accordance with the first aspect, wherein, a plurality of surface acoustic wave element areas including said IDT electrode are formed on said piezoelectric substrate having a sheet of wafer shape, said method further comprising the step of m) forming a plurality of surface acoustic wave device by separating said piezoelectric substrate into said respective surface acoustic wave element areas.

In accordance with the thirteenth aspect, a large number of WLP-type surface acoustic wave apparatuses can be simultaneously manufactured, and the manufacturing processes are consequently simplified greatly so that the mass productivity can be improved.

BRIEF DESCRIPTION OF THE DRAWINGS

FIG. 3 is a view describing a frame member forming process in accordance with a second embodiment.

FIG. 5 is a view describing an electrode forming method in accordance with a fourth embodiment.

FIG. 8 is a view describing a method for manufacturing a surface acoustic wave apparatus in accordance with a sixth embodiment.

FIG. 9 is a view describing a conventional method for manufacturing a surface acoustic wave apparatus.

BEST MODE FOR CARRYING OUT THE INVENTION

First Embodiment

A first embodiment relates to a method for manufacturing a surface acoustic wave apparatus.

Figure 1:
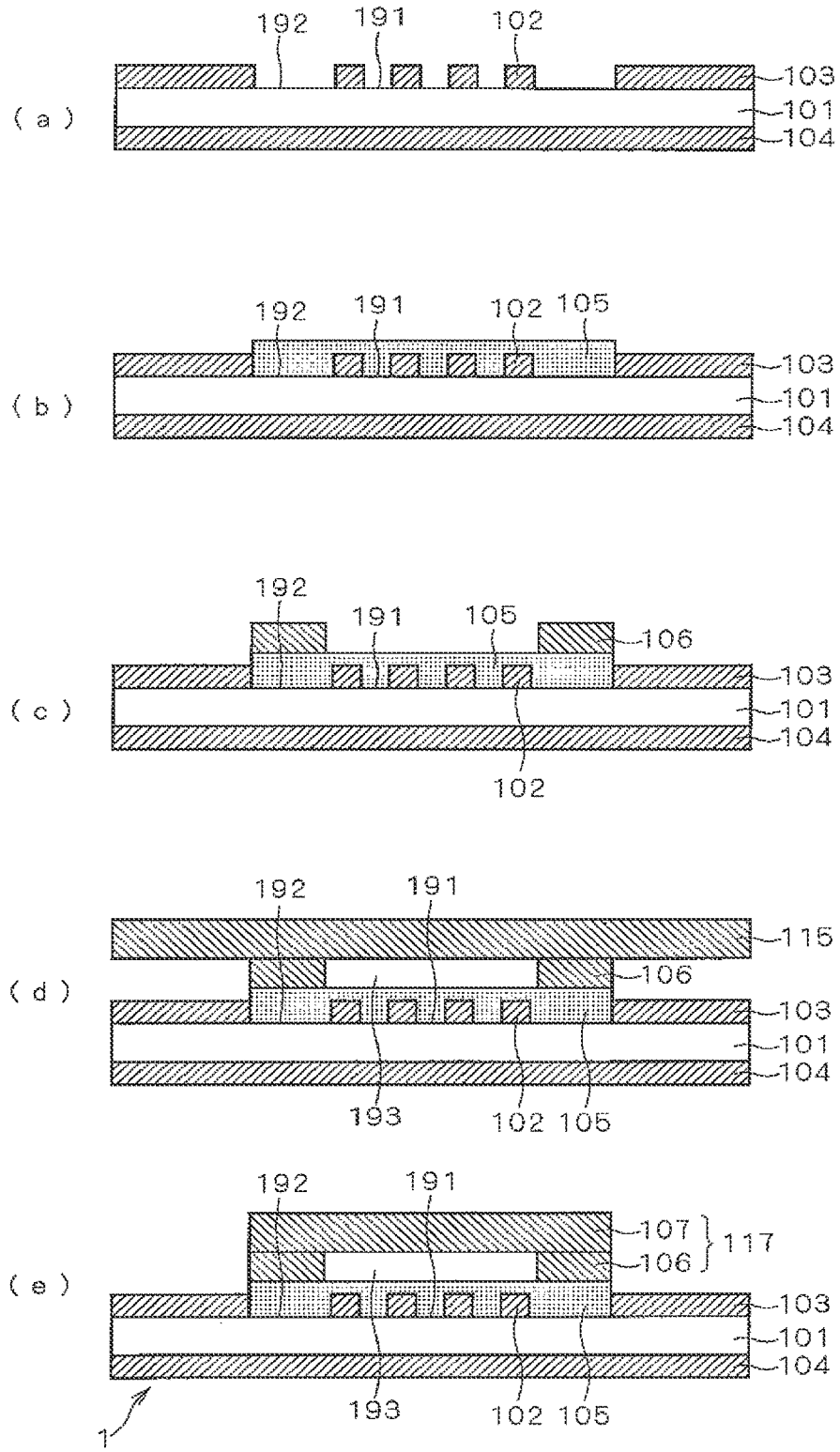
FIG. 1 is a view describing a method for manufacturing a surface acoustic wave apparatus in accordance with a first embodiment.

FIG. 1 is a view describing a method for manufacturing a surface acoustic wave apparatus in accordance with the first embodiment. FIGS. 1(a) to 1(d) are cross-sectional views of a work in process for a surface acoustic wave apparatus 1, and FIG. 1(e) is a cross-sectional view of the surface acoustic wave apparatus 1. FIGS. 1(a) to 1(e) are schematic views that help to improve understanding of the positional relationship among the respective parts of the work in process for the surface acoustic wave apparatus 1, or the surface acoustic wave apparatus 1.

As shown in FIG. 1(e), the surface acoustic wave apparatus 1 to be manufactured by the method for manufacturing a surface acoustic wave apparatus in accordance with the first embodiment is configured by a piezoelectric substrate 101, an IDT (InterDigital Transducer) electrode 102 and a connection line 103, formed on an upper surface serving as a main surface of the piezoelectric substrate 101, a rear-face electrode 104 formed on a lower surface serving as another main surface of the piezoelectric substrate 101, a protective film 105 that is formed on the upper surface of the piezoelectric substrate 101, and covers the IDT electrode 102, a frame member 106 formed on the upper surface of the protective film 105 so as to surround an area 191 in which the IDT electrode 102 is formed, and a lid member 107 mounted on the upper surface of the frame member 106 so as to cover the area 191. The frame member 106 and the lid member 107 are joined to each other to form a protective cover 117.

The surface acoustic wave apparatus 1 may be prepared as any of a filter, a resonator, a delay line, a trap and the like. Moreover, an elastic wave to be excited by the IDT electrode 102 may be either a Rayleigh wave or a SH wave. Moreover, in the case where the surface acoustic wave apparatus 1 is a filter, the surface acoustic wave apparatus 1 may be either a resonator-type filter or a transversal-type filter.

The following description will discuss a method for manufacturing a surface acoustic wave apparatus in accordance with the first embodiment in the order of its processes.

{IDT Electrode Forming Process}

Upon manufacturing the surface acoustic wave apparatus 1, first, as shown in FIG. 1(a), the IDT electrode 102 and the connection line 103 are formed on a surface acoustic wave element area 192 on the upper surface of the piezoelectric substrate 101, and a rear-surface electrode 104 is formed on the entire face of the lower surface of the piezoelectric substrate 101. Here, "the surface acoustic wave element area" refers to an area in which an IDT electrode 102 and a connection line 103, required for forming a single surface acoustic wave apparatus 1, are included.

The piezoelectric substrate 101 is a substrate made of a piezoelectric material. Examples of the piezoelectric material include single crystals of materials, such as lithium tantalate ($LiTaO_3$), lithium niobate ($LiNbO_3$), quartz ($SiO_2$), lithium tetraborate ($Li_2B_4O_7$), zinc oxide (ZnO), potassium niobate ($KNbO_3$), and langasite ($La_3Ga_3SiO_{14}$).

The IDT electrode 102 is a film made of a conductive material. Examples of the conductive material include aluminum (Al) alloys, typically represented by an aluminum-copper (Al—Cu) alloy, aluminum (Al) simple substance metal, and the like. Here, the IDT electrode 102 may be a film formed by laminating a plurality of layers made from different kinds of conductive materials.

The plane shape of the IDT electrode 102 is designed so that at least one pair of comb-shaped electrodes 121 and 122 (see FIG. 2) is meshed with each other so as to have electrode fingers thereof alternately arranged. The IDT electrode 102 functions as an excitation electrode that excites a surface acoustic wave over the upper surface of the piezoelectric substrate 101 in response to an excitation signal applied to the paired comb-shaped electrodes 121 and 122.

Here, it is not essential to form the surface acoustic wave apparatus 1 by using a single IDT electrode 102, and the surface acoustic wave apparatus 1 may be formed by connecting a plurality of IDT electrodes 102 in a connecting system such as a series connecting system and a parallel connecting system. By connecting a plurality of IDT electrodes 102, it is possible to form a ladder-type surface acoustic wave filter, a lattice-type surface acoustic wave filter, a double-mode surface acoustic wave filter and the like.

The connection line 103 is also a film made of a conductive material. Examples of the conductive material include an aluminum alloy typically represented by aluminum-copper alloy, aluminum simple substance metal and the like. Here, the connection line 103 may also be a film formed by laminating a plurality of layers made from different kinds of conductive materials.

The connection line 103 is connected to the IDT electrode 102. The connection line 103 is prepared so as to connect the IDT electrode 102 with an external circuit.

Although not particularly limited, the line width of the connection line 103 is desirably designed so that the end on the side that is not connected to the IDT electrode 102 is made wider. By making the width wider, the connection to the external circuit can be easily carried out.

The IDT electrode 102 and the connection line 103 can be obtained by patterning a film, formed by a thin-film forming method such as a sputtering method, a vapor deposition method and a CVD (Chemical Vapor Deposition) method, so as to be processed into a desired shape by a photolithography method or the like using a reduced projection exposing device (stepper) and a RIE (Reactive Ion Etching) device. Here, when the IDT electrode 102 and the connection line 103 are formed by using this method, it is preferable to use the same material for the IDT electrode 102 and the connection line 103, and also to form them by using the same process.

The rear face electrode 104 is also a film made of a conductive material. Examples of the conductive material include an aluminum alloy typically represented by aluminum-copper alloy, aluminum simple substance metal and the like. Here, the rear face electrode 104 may also be a film formed by laminating a plurality of layers made from different kinds of conductive materials.

The rear face electrode 104 is also formed by a thin-film forming method such as a sputtering method, a vapor deposition method and a CVD method. The rear face electrode 104 is not necessarily required. However, by installing the rear face electrode 104, pyroelectric charge induced onto the surface of the piezoelectric substrate 101 due to temperature changes can be earthed to be eliminated so that problems, such as cracks of the piezoelectric substrate 101 due to sparks or the like and sparks between the electrode fingers of the IDT electrode 102 and among the IDT electrodes 102, can be reduced.

Here, in order to confine the surface acoustic wave, a reflector electrode may be formed on the upper surface of the piezoelectric substrate 101. Such a reflector electrode is formed in two propagating directions of the surface acoustic wave, when viewed from the IDT electrode 102. Upon forming the reflector electrode, it is preferable to use the same material for the reflector electrode and the IDT electrode 102, and also to form them by using the same process.

{Protective Film Forming Process}

Next, as shown in FIG. 1(b), a protective film 105 for covering the entire portion of the IDT electrode 102 and one portion of the connection line 103 is formed.

The protective film 105 is a film made from an insulating material. Examples of the insulating material include silicon oxide (SiO.sub.2), silicon nitride (Si.sub.3N.sub.4), silicon (Si) and the like.

The protective film 105 can be obtained by removing one portion of a film formed by using a thin-film forming method such as a CVD method and a sputtering method, by a photolithography method. Here, the removing process of one portion is carried out so as to expose one portion of the connection line 103 so that the surface acoustic wave apparatus 1 can be connected to an external circuit.

The protective film 105 protects the IDT electrode 102 and the connection line 103, and reduces oxidation of the IDT electrode 102 and the connection line 103.

{Frame Member Forming Process}

Next, as shown in FIG. 1(c), a frame member 106, which surrounds the area 191 to which the IDT electrode 102 is attached, is formed on the surface acoustic wave element area 192. The frame member 106 may be formed in a manner so as to surround at least the IDT electrode 102, or may be formed so as to surround an area including the connection line 103 and the reflector electrode and the like, in addition to the IDT electrode 102.

The frame member 106 may be formed by patterning a film formed on the piezoelectric substrate 101 by using a normal film-forming method, or may be formed by bonding a frame-shaped member prepared as a separated member onto the piezoelectric substrate 101.

When the frame member 106 is formed by using the former method, for example, after a first resist film made from a first resist has been patterned by using a photolithography method, the resulting film is cured so that the frame member 106 is formed. In this case, for example, a resin, such as an epoxy resin, a polyimide resin, a BCB (benzocyclobutene) resin and an acrylic resin, may be used as the first resist. The film made from the first resist may be formed by applying a resist solution onto the surface acoustic wave element area 192 by using a spin coating method, a printing method or the like. Among these, the film made from the first resist is desirably formed by using the spin coating method. When the film made from the first resist is formed by using the spin coating method, even if there are some differences in level in a structure forming the base substrate, the film made from the first resist can be formed without causing gaps between it and the structure forming the base substrate; therefore, it is possible to form the frame member 106 having superior adhesion. The film made from the first resist, thus formed, is processed into the frame member 106 surrounding the area 191 in which the IDT electrode 102 is formed, after having been subjected to an exposing process and a developing process.

{Lid Member Forming Process}

Next, a lid member 107 having a film shape is mounted on the upper surface of the frame member 106 so that the frame member 106 and the lid member 107 are joined to each other. Thus, it becomes possible to form a protective cover 117 used for forming a tightly closed vibration space (tightly closed space) 193 between it and the area 191 in which the IDT electrode 102 is formed.

The lid member 107 may be formed by using processes in which, after a film-state layer has been mounted on the lid member 106, this is patterned by using a normal photolithography technique, or may be formed by mounting a lid-shaped member that has been subjected to a patterning process as a separated member on the upper surface of the frame member 106. Here, the film-state is defined as a film shape that is so thin that, when it contains a material having a photosensitive property, the reaction progresses in the entire thickness direction in response to light irradiation in a film thickness direction. Here, the following description exemplifies processes in which, after a second film 115, prepared as a film-shaped molded body made from a second resist, has been mounted, this is then patterned so that the lid member 107 is formed.

Upon forming the lid member 107 by using the second film 115, first, as shown in FIG. 1(d), the second film 115 is mounted on the upper surface of the frame member 106 so as to cover the area 191 in which the IDT electrode 102 is formed. For example, a resin, such as an epoxy resin, a polyimide resin, a BCB resin and an acrylic resin, may be used as the second resist. Here, the second film 115 is preliminarily molded into a film shape; therefore, by simply mounting it on the upper surface of the frame member 106, a vibration space 193 can be formed between it and the piezoelectric substrate 101. In order to mount the second film 115 on the upper surface of the frame member 106, by using a pasting machine capable of pasting the film by applying a pressure using a roller while carrying out temperature control, the second film 115 may be pasted onto the upper surface of the frame member 106, with the temperature and the pressure being set appropriately.

Next, as shown in FIG. 1(e), the portion of the second film 115 thus mounted, located outside the frame member 106, is removed through exposing and developing processes so as to be processed into the lid member 107 covering the area 191 in which the IDT electrode 102 is formed. Thereafter, the frame member 106 and the lid member 107 are joined to each other to form a protective cover 117. In order to join the frame member 106 and the lid member 107 to each other, the frame member 106 and the lid member 107 may be heated, or the frame member 106 and the lid member 107 may be irradiated with light, depending on the resist material. For example, in a case where an epoxy resin is used as the material for the frame member 106 and the lid member 107, the frame member 106 and the lid member 107 may be heated to about 100.degree. C. By using the protective cover 117 thus formed, the vibration space 193 can be formed and the IDT electrode 102 can be sealed so that it becomes possible to reduce oxidation or the like of the IDT electrode 102 and the like.

Here, in the case where, after the formation of the frame member 106, the lid member 107 is formed in the above manner and the two members are joined to each other, the cross-sectional shape of the frame member 106 tends to become a trapezoidal shape.

The reason for this is because, even when the frame member 106 immediately after the patterning process has a rectangular shape in its cross-sectional shape, it is deformed when heat or the like is once applied thereto, with the lid member 107 being formed thereon, so as to join the two members to each other.

{Reliability of Surface Acoustic Wave Apparatus}

After carrying out these IDT electrode forming process, protective film forming process, frame-member forming process and lid-member forming process, the surface acoustic wave apparatus 1, as shown in FIG. 1(e), can be manufactured. In accordance with the method for manufacturing a surface acoustic wave apparatus of the first embodiment, since it is not necessary to use a sacrifice layer for forming the vibration space 193, it is possible to prevent etchant or residual products due to etching from remaining inside the formed hollow structure (vibration space 193) upon removing the sacrifice layer as was found to be the case using the sacrifice layer. Therefore, in accordance with the method for manufacturing a surface acoustic wave apparatus of the first embodiment, it is possible to reduce degradation of electric characteristics of the manufactured surface acoustic wave apparatus 1. That is, it becomes possible to improve the reliability of the manufactured surface acoustic wave apparatus 1.

{Connection to External Circuit}

In order to connect the surface acoustic wave apparatus 1 with an external circuit, as shown in FIG. 1(e), the connection line 103 is drawn out of the protective cover 117, and an electrode for use in external connection may be formed on the connection line 103 outside the protective cover 117, or a wire for use in external connection may be bonded to the connection line 103.

As described above, in the case where one portion of the connection line 103 is extended outside the protective cover 117, that is, outside the frame member 106, in a manner so as to be drawn outside thereof, the position of the connection line 103 can be freely determined in accordance with the external circuit, with the vibration space 193 being sealed. For this reason, it becomes possible to manufacture a surface acoustic wave apparatus 1 having high general-purpose utility. However, it is not necessarily required to draw the connection line 103 out of the protection cover 117. For example, a via hole may be formed on the piezoelectric substrate 101 inside the portion covered with the protective cover 117 so that the connection line 103 is connected to the external circuit on the lower surface of the piezoelectric substrate 101, or through holes may be formed on a portion of the frame member 106 of the protective cover 117 and one portion of the lid member 107 located thereon so that it is connected to the external circuit on the upper face of the protective cover 117.

{Formation of Frame Member on Upper Surface of Protective Film}

Figure 2:
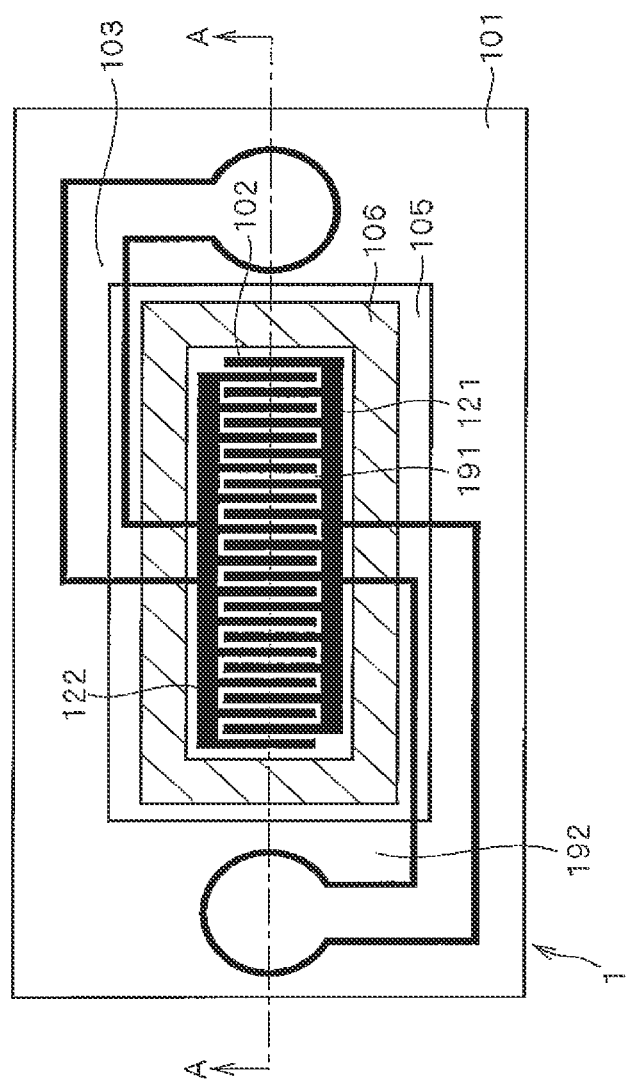
FIG. 2 is a perspective plan view of the surface acoustic wave apparatus.

FIG. 2 is a perspective plan view showing the surface acoustic wave apparatus 1. The aforementioned FIG. 1(e) is a cross-sectional view of the surface acoustic wave apparatus 1 taken along line A-A of FIG. 2. In FIG. 2, the frame member 106 is indicated by a hatched portion so that the layout of the frame member 106 is easily found. As shown in FIG. 2, the protective film 105 is formed on one portion of an area in which the IDT electrode 102 and the connection line 103 are formed.

The frame member 106 is desirably formed on the upper surface of the protective film 105 covering the IDT electrode 102. Although the reason for this has not been clarified, the adhesion of the frame member 106 onto its formation face (here, upper surface of the protective film 105) can be improved in the case where the frame member 106 is formed on the upper face of the protective film 105. In a case where, for example, an epoxy resin is used as the first resist, with silicon oxide being used as a material for the protective film 105, the adhesion of the frame member 106 onto its formation face can be improved. Presumably, this effect is derived from a hydrogen bond between silicon oxide and the epoxy resin.

Moreover, when the connection line 103 is drawn outside the protective cover 117, the frame member 106 bridges over the connection line 103; however, by forming the frame member 106 on the upper surface of the protective film 105, since the difference in level caused by the connection line 103 can be alleviated by the protective film 105, it is possible to form the frame member 106 on its virtually flat formation face. For this reason, in the case where the connection line 103 is drawn outside the protective cover 117, forming the frame member 106 on the upper face of the protective film 105 makes it possible to connect the frame member 106 onto its formation face more firmly, in comparison with forming the frame member 106 on a portion other than the upper face of the protective film 105.

However, these facts are not intended to restrict the frame member 106 from being formed on a portion other than the upper face of the protective film 105.

{Selection of First Resist and Second Resist}

In the case where the same material is used for the first resist and the second resist in the frame-member forming process as well as in the lid-member forming process, upon joining the frame member 106 and the lid member 107 to each other, the two members may be formed into an integral unit. Moreover, in the case where the same material is used for the first resist and the second resist, since the joined interface of the two members forms an interface formed by the same material, the adhesion strength of the two members can be improved, and the air-tight property of the protective cover 117 can be improved. Therefore, it is possible to manufacture a surface acoustic wave apparatus 1 having high reliability. In particular, in a case where the frame member 106 and the lid member 107 are heated in a range from 100.degree. C. to 200.degree. C., with an epoxy resin being used as the first resist and the second resist, since the polymerization can be accelerated, the adhesion strength of the two members and the air-tight property of the protective cover 117 can be improved.

Moreover, in the case where the same material is used as the first resist and the second resist, the frame member 106 and the lid member 107 thus formed are made of the same material, thereby making it possible to form the protective cover 117 as an integral unit.

Second Embodiment

A second embodiment relates to a frame-member forming process that can be adopted in place of the frame-member forming process of the method for manufacturing a surface acoustic wave apparatus of the first embodiment.

FIG. 3 is a view describing a frame-member forming process in accordance with the second embodiment. FIGS. 3(a) and 3(b) are cross-sectional views of a work in process of the surface acoustic wave apparatus 1. FIGS. 3(a) and 3(b) are schematic views that help to improve understanding of the positional relationship among the respective parts of the work in process for the surface acoustic wave apparatus 1.

In the frame-forming process of the second embodiment, a film-shaped molded body is used as a film made of a first resist. That is, first, as shown in FIG. 3(a), a first film 219 made from the first resist is mounted on a piezoelectric substrate 101. Thereafter, as shown in FIG. 3(b), the first film 219 is patterned by a photolithography method, and then cured.

In accordance with the frame-forming process of the second embodiment, since a frame member 106 having an uniform thickness can be formed, the second film 115 can be mounted on the upper surface of the frame member 106 without any gap. For this reason, it becomes possible to firmly seal the vibration space 193 on the surface acoustic wave element area 192 by using a simple process.

Moreover, in accordance with the frame-member forming process of the second embodiment, since the first film 219 can be patterned by using the photolithography method, it is possible to form a fine pattern in the order of several micrometers at desired positions with high precision. Therefore, the frame member 106 can be formed into a desired pattern with high precision.

Third Embodiment

A third embodiment relates to a lid-member forming process that can be adopted in place of the lid-member forming process of the method for manufacturing a surface acoustic wave apparatus of the first embodiment.

Figure 4:
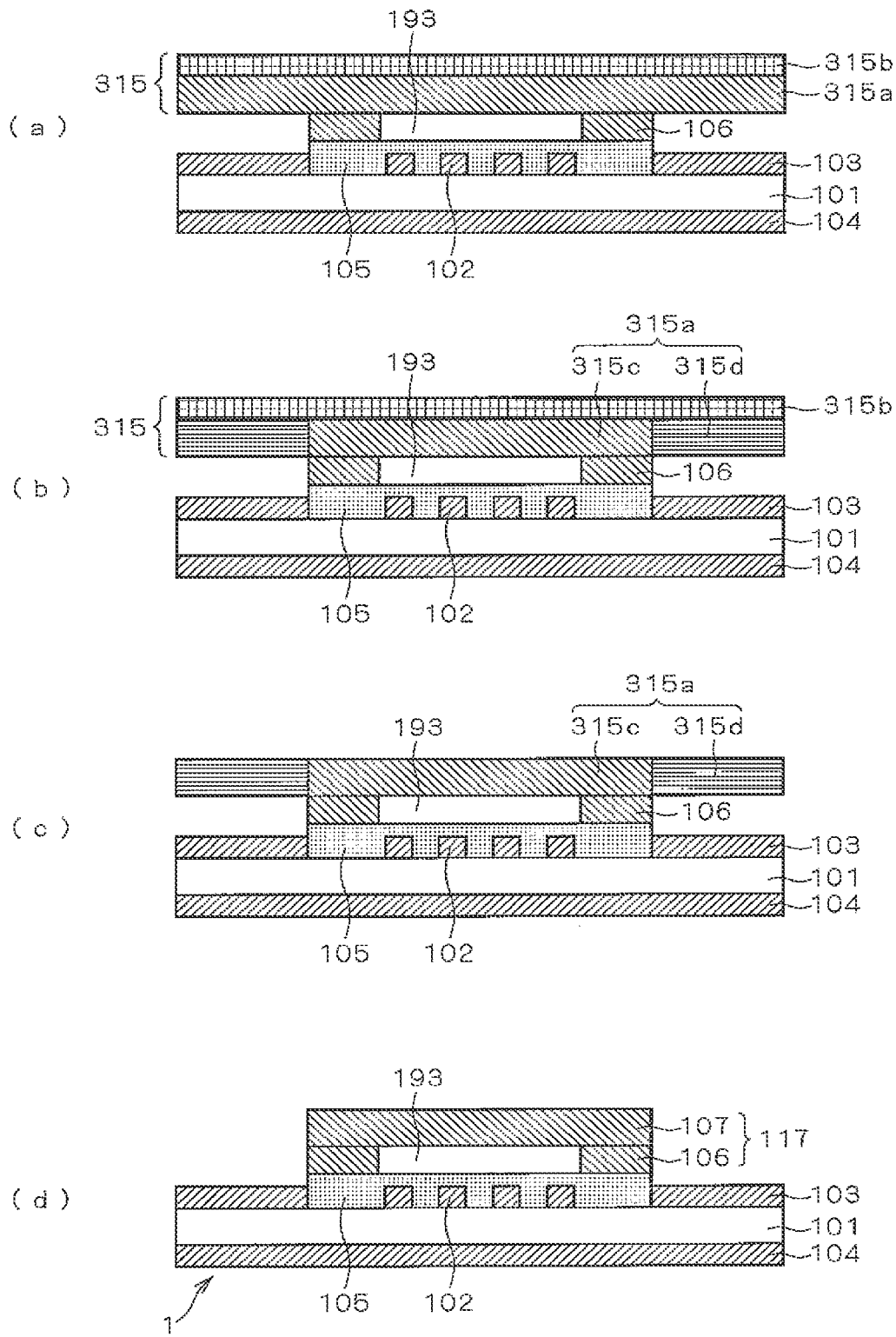
FIG. 4 is a view describing a lid member forming process in accordance with a third embodiment.

FIGS. 4(a) to 4(d) are views describing a lid-member forming process in accordance with the third embodiment. FIGS. 4(a) to 4(c) are cross-sectional views of a work in process of the surface acoustic wave apparatus 1, and FIG. 4(d) is a cross-sectional view of the surface acoustic wave apparatus 1. FIGS. 4(a) to 4(d) are schematic views that help to improve understanding of the positional relationship among the respective parts of the work in process for the surface acoustic wave apparatus 1 or of the surface acoustic wave apparatus 1.

As shown in FIG. 4(a), the second film 315 to be used for the lid-member forming process of the third embodiment is formed by laminating two layers, that is, a resin layer 315a and a holding layer 315b having a higher Young's modulus as compared with that of the resin layer 315a.

More specifically, a layer that has a photosensitive property, is cured upon application of heat, and is also superior in mechanical strength as well as in chemical resistance is desirably used as the resin layer 315a. For example, the layer made from a resin, such as an epoxy resin, a polyimide resin, a BCB resin and an acrylic resin, may be used as the layer. As the material for the holding layer 315b, a material, such as a PET (PolyEthylene Terephthalate) film, which has a Young's modulus higher than that of the resin layer 315a and a superior peeling property from the resin layer 315a, and is thermally stable, is used. Here, the holding layer 315b preferably has a translucent property. This property is required because the resin layer 315a is exposed through the holding layer 315b. Moreover, the holding layer 315b is required to have a heat resistant property so as not to be denatured even under a temperature for curing the resin layer 315a.

Here, the Young's modulus of the resin layer 315a and the holding layer 315b is measured by using a method for measuring the Young's modulus of a thin film, such as a nano-indentation method used under conditions in compliance with, for example, the ISO standard (for example, ISO 14577).

The upper surface of the protective cover 117 formed in such a process, that is, the upper surface of the lid member 107, has a surface roughness greater than that of the lower surface. This property is required for separating the holding layer 315b after the resin layer 315a has been cured.

In the lid-member forming process of the third embodiment, first, as shown in FIG. 4(a), a second film 315 is mounted on the upper surface of the frame member 106 so that the holding layer 315b is located on the upper side, that is, the resin layer 315a is made in contact with the frame member 106.

Next, as shown in FIG. 4(b), the second film 315 is patterned by using a photolithography method. That is, after the second film 315 has been exposed by using a mask (not shown) from above the holding layer 315b, this is heated so that the resin layer 316a is formed into an exposed portion 315c and an unexposed portion 315d. Here, the exposed portion 315c is cured by the heating process after exposure, and formed into a lid member 107, and simultaneously joined to the lid member 106.

Next, as shown in FIG. 4(c), the holding layer 315b of the second film 315 is removed.

Next, as shown in FIG. 4(d), the resin layer 315a (the unexposed portion 315d in this example), located outside the frame member 106, is removed by a developing process so as to form a separated lid member 107, and this is further heated. Thus, the lid member 107 is completely cured, and the frame member 106 and the lid member 107 are completely formed into an integral unit; thus, a protective cover 117 is obtained.

Here, the holding layer 315b may be removed after the developing process.

In accordance with the lid-forming method of the third embodiment, the second film 315 can be uniformly pasted onto the upper surface of the frame member 106 and joined thereto. Moreover, even before the curing process of the second film 315, since the holding layer 315b having a higher Young's modulus suppresses the entire deformation of the second film 315, a vibration space 193 can be maintained between it and the IDT electrode 102. For this reason, the vibration space 193 is positively formed, without being collapsed during the placing, exposing and heating of the second film 315. Moreover, since the holding layer 315b holds the resin layer 315a, the second film 315 can be easily handled.

In accordance with the lid-member forming process of the third embodiment, since the second film 315 can be patterned by using a photolithography method, a fine pattern in the order of several micrometers can be formed at a desired position with high precision. For this reason, the lid member 307 can be formed into a desired pattern with high precision.

Fourth Embodiment

A fourth embodiment relates to an electrode-forming method that is successively carried out after the IDT-electrode forming process, the protective-film forming process, the frame-member forming process and the lid-member forming process in accordance with the method for manufacturing a surface acoustic wave apparatus of the first embodiment.

FIGS. 5(a) to 5(h) are views describing an electrode-forming method in accordance with the fourth embodiment. FIGS. 5(a) to 5(g) are cross-sectional views of a work in process of a surface acoustic wave apparatus 4, and FIG. 5(h) is a cross-sectional view of the surface acoustic wave apparatus 4. Here, in FIGS. 5(a) to 5(h), the same components as those shown in FIGS. 1(a) to 1(e) are denoted by the same reference numerals.

As shown in FIG. 5(h), the surface acoustic wave apparatus 4 on which an electrode used for connecting with an external circuit is formed by using an electrode-forming method in accordance with the fourth embodiment is provided with a remaining portion 408a of a plating base layer 408, a pillar-shaped electrode 410, a sealing resin film 411, a protective layer 412 and an external connection electrode 413 in addition to the piezoelectric substrate 101 having a sheet of wafer shape, the IDT electrode 102, the connection line 103, the rear surface electrode 104, the protective film 105, the frame member 106 and the lid member 107.

The following description will discuss the electrode-forming method in accordance with the fourth embodiment in the order of processes.

{Plating Base Layer Forming Process}

Upon forming an electrode used for connecting with an external circuit, first, as shown in FIG. 5(a), a plating base layer 408 covering the surface acoustic element area 192 on the piezoelectric substrate 101 with the protective cover 117 formed thereon is formed from a state as shown in FIG. 1(e).

The plating base layer 408 is formed so as to allow metal forming a pillar-shaped electrode 410 that will be described later to be electrically or chemically deposited. For this reason, the plating base layer 408 is desirably formed by using the same material as that of the pillar-shaped electrode 410. Here, in general, copper (Cu) is used. In a case where copper is used as the plating base layer 408, from the viewpoint of adhesion to an aluminum-copper (Al—Cu) alloy forming the connection line 103, an adhesion layer, made from chromium (Cr) or titanium (Ti), is desirably interposed between the connection line 103, made from the aluminum-copper alloy, and the plating base layer 408.

The plating base layer 408 is preferably formed to have a thickness of 100 nm or more. This structure allows to provide a thickness required for flowing a current in a stable manner upon forming the pillar-shaped electrode 410 by using an electric plating method.

The plating base layer 408 is formed on the entire surface of the piezoelectric substrate 101 containing an area in which the pillar-shaped electrode 410 is formed, by using, for example, a titanium-copper (Ti—Cu). By forming this plating base layer 408, metal such as copper may be formed by using the electric plating method with a high thickness, with the plating base layer 408 being interposed therebetween.

The method for forming the plating base layer 408 is not particularly limited, and in the case where the plating base layer 408 is formed by using a flash-plating method, since no wiring pattern used for flowing a current to a portion to be plated is required, it becomes possible to miniaturize the surface acoustic wave apparatus 4. In contrast, in the case where the plating base layer 408 is formed over the entire structural body including the protective cover 117 by using the flash-plating method, there is a possibility that no plated portion might occur on a portion having a difference in level. This is caused because step coverage is not sufficient on a portion having a large difference in level since the plating base layer 408 formed by the flash-plating method is very thin. For this reason, as shown in FIG. 5(a), it is desirable so as not to form such a large difference in level as to cause a portion on which no plating base layer 408 is formed on a portion except for the protective cover 117. More specifically, the difference in level on the portion except for the protective cover 117 is preferably set to a difference in level having one-half the thickness of the plating base layer 408 or less. For example, when the thickness of the plating base layer 408 is 0.7 .mu.m, the difference in level is set to 0.35 .mu.m or less. With this arrangement, for example, even if there is a portion with no plating on the difference in level (for example, side face portion 195 of the protective cover 117) of the protective cover 117, with no conduction being available between the upper face of the lid member 107 and the surface on which the connection line 103 is formed, the plating base layer 408 on the surface which has the connection line 103 for use in forming the pillar-shaped electrode 410 formed thereon is positively connected thereto electrically. For this reason, upon forming the pillar-shaped electrode 410 by using an electric plating method, it is possible to positively flow a current to the plating base layer 408.

{Plating Resist Film Forming Process}

Next, as shown in FIG. 5(b), a plating resist film 409 having an opening section 416 above the connection line 103 positioned on the outside of the protective cover 117 is formed on the plating base layer 408.

The plating resist film 409 is formed on the plating base layer 408 by using a method, such as a spin coating method. Here, by adjusting the viscosity of a resist solution to be used and the number of coatings by the spin coating processes, the thickness of the plating resist film 409 can be controlled in a range from several .mu.m to several hundred .mu.m. Moreover, the opening section 416 of the plating resist film 409 is desirably formed by using a general photolithography method.

{Pillar-Shaped Electrode Forming Process}

Next, as shown in FIG. 5(c), a pillar-shaped electrode 410 is formed on the plating base layer 408 exposed to the bottom of the opening section 416 by using a plating method.

The pillar-shaped electrode 410 can be formed by using a method, such as an electric plating method, an electroless plating method and a stud bump method; however, the electric plating method is preferably used for forming the electrode. By using the electric plating method, the growing rate of the plated film becomes faster and the plated film is easily made thicker; therefore, the degree of freedom of the height of the pillar-shaped electrode 410 can be enhanced. Moreover, by using the electric plating method, the adhesion to the plating base layer 408 can be improved. Here, the thickness of the plated film is determined by plating process time, and when a plated film having a thickness exceeding 30 .mu.m is formed, the film is preferably formed by using an electric plating method having a fast growing rate.

Examples of the material for the pillar-shaped electrode 410 include solder, cupper (Cu), gold (Au) and nickel (Ni). In particular, in the case where solder or cupper is used as the material for the pillar-shaped electrode 410, since the material costs for plating can be reduced, the surface acoustic wave apparatus 4 can be manufactured at low costs.

{Removing Process}

Next, as shown in FIG. 5(d), the plating resist film 409 and the plating base layer 408 are removed, with the pillar-shaped electrode 410 being left.

The plating resist film 409 can be removed by using an organic solvent, such as acetone and isopropyl alcohol (IPA), and an alkaline organic solvent, such as dimethylsulfoxide.

The plating base layer 408, for example, when made from copper, can be removed by an aqueous solution of ferric chloride, or by a mixed solution of phosphoric acid and hydrogen peroxide solution. In contrast, the plating base layer 408, for example, when made from titanium, can be removed by an aqueous solution of diluted hydrofluoric acid or by a mixed solution of ammonia and hydrogen peroxide solution. Here, in order to reduce damage to a silicon oxide (SiO.sub.2) film formed beneath the plating base layer 408 or the connection line 103 that is made of an aluminum-copper alloy or the like, the mixed solution of ammonia and hydrogen peroxide solution is desirably used for removing the layer.

Even in the case where the plating base layer 408 is removed after the pillar-shaped electrode 410 has been exposed by removing the plating resist film 409 as described above, since the plating base layer 408 is so thin that, although one portion of peripheral edge portion of the plating base layer 408 located beneath the pillar-shaped electrode 410 is removed, the other portions are left as remaining portions 408a. Consequently, the pillar-shaped electrode 410 is allowed to remain.

{Sealing Resin Film Forming Process}

Next, as shown in FIG. 5(e), on the surface acoustic wave element area 192 of the piezoelectric substrate 1, a sealing resin film 411 to cover the protective cover 117 and the pillar-shaped electrode 410 is formed.

As the material for the sealing resin film 411, it is preferable to use an epoxy resin, which can be adjusted by mixing filler therein so that its thermal expansion coefficient becomes virtually the same as that of the piezoelectric substrate 101, and is also superior in chemical resistance. In particular, by using an epoxy resin having a linear expansion coefficient close to that of the piezoelectric substrate 101 or an epoxy resin having a low elastic modulus, it is desirable to reduce the stress to be applied to the piezoelectric substrate 101.

Moreover, when bubbles are mixed in the sealing resin film 411, it is impossible to seal a structural body including the protective cover 117 in a stable manner; therefore, it is also preferable to print the sealing resin film 411 by using a vacuum printing method.

Here, the thickness of the sealing resin film 411 is desirably set to such a degree as to cover the pillar-shaped electrode 410.

{Pillar-Shaped Electrode Exposing Process}

Next, as shown in FIG. 5(f), the upper surface of the sealing resin film 411 is ground so that the pillar-shaped electrode 410 is exposed.

More specifically, the upper surface of the sealing resin film 411 is ground by a grinding blade by using a grinder until the pillar-shaped electrode 410 has been exposed. Here, a finishing process may be carried out by using buffing or the like in order to favorably connect the pillar-shaped electrode 410 to an external connection electrode 413, which will be described later.

{External Connection Electrode Forming Process}

Next, as shown in FIG. 5(h), the external connection electrode 413 is formed on the upper surface of the pillar-shaped electrode 410.

The external connection electrode 413 may be a bump formed by using solder, such as lead-zinc (PbSn) solder, lead (Pb)-free solder, gold-zinc (AuSn) solder and gold-germanium (AuGe) solder, or may be prepared as a flat pad formed by a thin film made from a conductive material. For example, the external connection electrode 413 may be formed by screen-printing cream solder on the upper portion of the pillar-shaped electrode 410 so as to be reflowed thereon.

{Packaging of Surface Acoustic Wave Apparatus}

By carrying out these plating base layer forming process, plating resist-film forming process, pillar-shaped electrode-forming process, removing process, sealing resin-film forming process, pillar-electrode exposing process and external connection electrode forming process, it is possible to provide a surface acoustic wave apparatus 4 that can be surface-packaged. Moreover, by forming the external connection electrode 413 on the pillar-shaped electrode 410 exposed to the upper surface of the sealing resin 411, the surface acoustic wave apparatus can be further easily packaged.

In accordance with the electrode-forming method of the fourth embodiment, since the surface acoustic wave apparatus 4 can be manufactured on a wafer-level, it is possible to provide the surface acoustic wave apparatus 4 without the necessity of complicated processes. Moreover, in accordance with the electrode-forming method of the fourth embodiment, since the material used for forming the external connection electrode 413 can be selected depending on a packaging substrate on which the surface acoustic wave apparatus 4 is packaged, the joining reliability between the surface acoustic wave apparatus 4 and the packaging substrate can be improved.

Furthermore, when the surface acoustic wave apparatus 4 manufactured by using the electrode-forming method in accordance with the fourth embodiment is applied to a multiplexer, the pillar-shaped electrode 410 can also be used as a heat-radiating electrode. Therefore, by placing the pillar-shaped electrode 410 near a heat-generating portion on the IDT electrode 102, it is possible to provide a surface acoustic wave apparatus 4 having a superior heat radiating property. Although it differs depending on working frequency as well as on the connection method when a plurality of IDT electrodes 102 are used, the heat-generating portion on the IDT electrode 102 is located near the center of the IDT electrode 102 in a case of the surface acoustic wave apparatus 4 serving as a resonator. Moreover, by properly designing the layout, number, diameter and the like of the pillar-shaped electrode 410, the heat radiating property can be improved.

{Protective Layer Forming Process}

Upon manufacturing the surface acoustic wave apparatus 4, a process for forming a protective layer 412 made from a material having virtually the same heat expansion coefficient as that of the sealing resin film 411 on the lower surface of the piezoelectric substrate 101 may be further prepared. Here, FIGS. 5(*a*) to 5(*h*) show an electrode-forming method in the case where such a protective-layer forming process is prepared between the pillar-shaped electrode exposing process and the external connection electrode-forming process.

By using this protective-layer forming process, since the resulting structure allows the protective layer 412 to protect the lower surface of the piezoelectric substrate 101 on which no IDT electrode 102 is formed, the impact resistant property of the surface acoustic wave apparatus 4 can be improved during the manufacturing process and after the manufacturing process. For this reason, it becomes possible to suppress occurrence of defects, such as cracking and chipping, in the surface acoustic wave apparatus 4, to improve the yield, and consequently to improve the reliability of the surface acoustic wave apparatus 4.

Here, in the case where the protective layer 412 is formed over the lower surface and the side faces of the piezoelectric substrate 101, since the resulting structure makes it possible to protect the lower surface and the side faces of the piezoelectric substrate 101, it becomes possible to suppress moisture from infiltrating through the interface between the piezoelectric substrate 101 and the sealing resin 411, and consequently to achieve a surface acoustic wave apparatus 4 in which the air-tight property and the moisture resistance are improved.

Moreover, since the material having virtually the same thermal expansion coefficient as that of the sealing resin film 411 is used as the protective layer 412 for the lower surface of the piezoelectric substrate 101, it becomes possible to alleviate a stress caused by the sealing resin film 411 during the manufacturing process, to prevent generation of warping in the piezoelectric substrate 101, and consequently to improve the reliability of the surface acoustic wave apparatus 4.

Here, this protective-layer forming process may be added as a process between the proceeding process of the above-mentioned IDT electrode-forming process and the succeeding process of the external connection electrode-forming process on demand; however, in a case where it is prepared after the sealing resin film forming process for forming the sealing resin film 411 on the upper surface of the piezoelectric substrate 101, the stress to be applied to the piezoelectric substrate 101 due to a difference in thermal expansion coefficients between the piezoelectric substrate 101 and the sealing resin film 411 can be cancelled between the upper surface and the lower surface of the piezoelectric substrate 101. In particular, in a case where, as shown in FIG. 5(*g*), the protective-film forming process is prepared between the pillar-shaped electrode exposing process and the external connection electrode forming process, it is possible to reduce a processing problem due to a warp in the piezoelectric substrate 101 and a stress (stress component) applied to the piezoelectric substrate 101, and consequently to improve the reliability of the surface acoustic wave apparatus 4.

Although the material for the protective layer 412 is not particularly limited as long as its thermal expansion coefficient is virtually the same as that of the sealing resin film 411, an epoxy resin is preferably used as the material. In the case where the epoxy resin is used, since by adding a filler such as silicon oxide ($SiO_2$) thereto, it is possible to control the thermal expansion coefficient, and consequently to cancel the stress to be applied to the piezoelectric substrate 101 between the upper surface and the lower surface of the piezoelectric substrate 101. Moreover, in the case where the epoxy resin is used, since the moisture permeability is reduced and the water absorbing property is also improved, it is possible to prevent filtration of moisture into the surface acoustic wave apparatus 4.

{Height of Pillar-Shaped Electrode}

As shown in FIG. 5(*d*), in the pillar-shaped electrode forming process, the pillar-shaped electrode 410 is desirably formed so as to have a height higher than the protective cover 117, and as shown in FIG. 5(*f*), in the pillar-shaped electrode exposing process, the pillar-shaped electrode 410 is desirably exposed to the upper surface of the sealing resin film 411, with the protective cover 117 being covered with the sealing resin film 411. With this arrangement, after the pillar-shaped electrode exposing process, the height of the uppermost portion of the pillar-shaped electrode 410 can be made higher than the uppermost portion of the protective cover 117. Here, the heights of the pillar-shaped electrode 410 and the protective cover 117 refer to heights from the surface acoustic wave element area 192. Thus, even when the sealing resin film 411 is ground by the pillar-shaped electrode exposing process, the portion of the lid member 107 of the protective cover 117 is prevented from being exposed or ground so that the air-tight property of the protective cover 117 for ensuring the vibration space 193 of surface acoustic wave to be excited by the surface acoustic wave apparatus 4 can be sufficiently maintained.

{Formation of Plating Resist Film}

In the plating resist-film forming process, the plating resist film 409 is desirably formed by repeating coating and curing processes of the resist material plurality of times. By forming the plating resist film 409 by using divided processes of plurality of times, it is possible to form the plating resist film 409 having a desired thickness by the use of the resist material having been adjusted by taking its coating property, handling property and the like into consideration. Moreover, since the plating resist film 409 can be formed into a desired thickness, it is possible to form the pillar-shaped electrode 410 having a desired height. In particular, the coating and curing processes of the resist material are carried out until its height has become virtually the same as the height of the uppermost portion of the protective cover 117, and after the large difference in level caused by the protective cover 117 has been buried to provide a flat face, the coating and curing processes of the resist material are further repeated so as to obtain a desired thickness; thus, these processes are preferably used because the upper surface of the plating resist film 409 is made into a flat face.

Fifth Embodiment

A fifth embodiment relates to a surface acoustic wave apparatus 5 that can be manufactured by the method for manufacturing a surface acoustic wave apparatus of the first embodiment and the electrode-forming method of the second embodiment.

Figure 6:
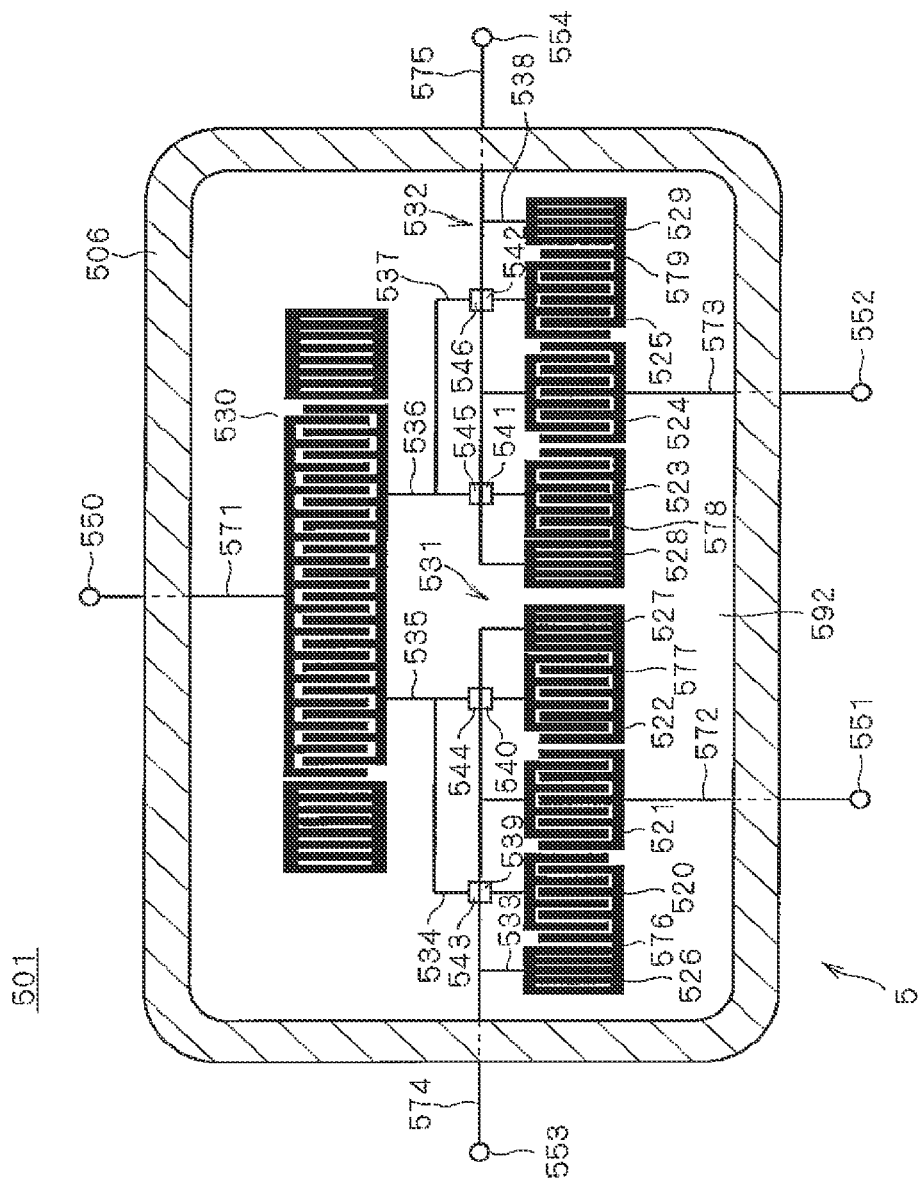
FIG. 6 is a plan view of a surface acoustic wave apparatus in accordance with a fifth embodiment.

FIG. 6 is a plan view showing the layout of a plurality of IDT electrodes 520 to 525 and 530, a plurality of conductor patterns 533 to 538 and the like in the surface acoustic wave apparatus 5. FIG. 6 is a schematic view that helps to improve understanding of the positional relationship among the respective parts of the surface acoustic wave apparatus 5. In FIG. 6, a frame member 506 is indicated by a hatched portion.

As shown in FIG. 6, the surface acoustic wave apparatus 5 is provided with a piezoelectric substrate 501, the IDT electrodes 520 to 525 and 530, reflector electrodes 526 to 529, first conductor patterns 533 and 538, second conductor patterns 534 to 537, insulating layers 539 to 542, an input terminal 550, output terminals 551 and 552, ground terminals 553 and 554 and connection lines 571 to 575.

{Surface Acoustic Wave Element}

A plurality of the IDT electrodes 520 to 525 and 530 are formed in a surface acoustic wave element area 592.

The three IDT electrodes 520 to 522 and two reflector electrodes 526 and 527, placed on the two sides thereof, form a surface acoustic wave element 531, and the three IDT electrodes 523 to 525 and two reflector electrodes 528 and 529, placed on the two sides thereof, form a surface acoustic wave element 532.

In the surface acoustic wave apparatus 5, the surface acoustic wave elements 531 and 532, parallel-connected to the IDT electrode 530, are disposed on a piezoelectric substrate 601. These surface acoustic wave elements 531 and 532 form a longitudinally joined resonator.

The surface acoustic wave elements 531 and 532 are parallel-connected to the input terminal 550 to which an unbalanced signal is inputted through the IDT electrode 530. The right and left IDT electrodes 520 and 522 and the right and left IDT electrodes 523 and 525, connected to the input terminal 550, are subjected to an electric field applied between paired comb-shaped electrodes that are made face to face with each other so that a surface acoustic wave is exited. The surface acoustic wave thus excited is propagated up to the IDT electrodes 521 and 524 in the center. Moreover, the phase of the signal in the IDT electrode 521 in the center forms a reversed phase that differs from the phase of the signal in the IDT electrode 524 in the center by 180.degree. Therefore, in the surface acoustic wave apparatus 5, the signal is finally transmitted from one of the respective comb-shaped electrodes of the IDT electrodes 521 and 524 in the center to the corresponding one of the output terminals 551 and 552, and the resulting signal is outputted as a balanced signal. With this arrangement, the surface acoustic wave apparatus 5 achieves a balance-unbalance conversion function.

{Terminals}

The same pillar-shaped electrode (not shown) as the pillar-shaped electrode 410 of the surface acoustic wave apparatus 4 is formed on the input terminal 550, the output terminals 551 and 552 and ground terminals 553 and 554 so as to be connected to external circuits.

{Frame Member}

A frame member 506 is placed so as to surround the IDT electrodes 520 to 525 and 530, and the conductor patterns 533 to 538. In the same manner as in the surface acoustic wave apparatus 4, a lid member (not shown) is mounted on the upper surface of the frame member 506, and the lid member is joined to the frame member 506. The frame member 506 and the lid member form a protective cover for use in sealing.

{Connection Line}

Connection lines 571 to 575 are drawn out of the frame member 506, and respectively connected to the input terminal 550, the output terminals 551 and 552 and the ground terminals 553 and 554. The connection lines 571 to 573 respectively connect the input terminal 550 and the output terminals 551, 552 to the IDT electrodes 530, 521 and 524. The connection lines 574 and 575 allow the IDT electrodes 520 to 525 to be earthed through the first conductor patterns 533 and 538.

The connection lines 571 to 575 are connected to the IDT electrodes 520 to 525 and 530 so as to connect the IDT electrodes 520 to 525 and 530 to external circuits. The connection lines 571 to 575 include not only (i) a group of lines directly connected to the IDT electrodes 530, 521 and 524, such as the connection lines 571 to 573 that connect the input terminal 550 and the output terminals 551 and 552 serving as connection terminals to external circuits with the IDT electrodes 530, 521 and 524, but also (ii) a group of lines that indirectly connect the IDT electrodes 520 to 525 to external circuits, such as connection lines 574 and 575 that connect the ground terminals 553 and 554 serving as connection terminals to external circuits through the first conductor patterns 533 and 538 with the IDT electrodes 520 to 525.

{Conductor Pattern}

As shown in FIG. 6, a plurality of conductor patterns 533 to 538, connected to the IDT electrodes 520 to 525 and 530, are formed in the surface acoustic wave element area 592. The conductor patterns 533 to 538 include first conductor patterns 533 and 538, and second conductor patterns 534 to 537 that intersect with the first conductor patterns 533 and 538 with the insulating layers 539 to 542 interposed therebetween.

By allowing the first conductor patterns 533 and 538 to intersect with the second conductor patterns 534 to 537, the degree of freedom of wiring the conductor patterns 533 to 538 can be improved, and the gap (step gap) between the IDT electrode 530 and the IDT electrodes 520 to 525 is consequently narrowed so that the two kinds of the electrodes can be closely disposed. Thus, the region occupied by the area in which the IDT electrodes 520 to 525 and 530 are formed can be made smallest so that a small-size surface acoustic wave apparatus 5 can be achieved.

Moreover, conductor-pattern intersecting portions at which the first conductor patterns 533, 538 and the second conductor patterns 534 to 547 intersect with one another are arranged with insulating layers 539 to 542 being interposed between the first conductor patterns 533, 538 and the second conductor patterns 534 to 547 serving as conductors. For this reason, at the conductor-pattern intersecting portions, capacity-forming portions 543 to 546 that provide capacities between the first conductor patterns 533, 538 and the second conductor patterns 534 to 547 can be formed. The capacity-forming portions 543 to 546 are placed by taking it into considerations that, when parasitic capacities are generated due to the layout of the IDT electrodes 520 to 525 and 530, and the conductor patterns 534 to 538, signals to be transmitted to the output terminals 551 and 552 for outputting balanced signals might have mutually different amplitudes or their phases might deviate from the reversed phases to cause degradation of the balance. That is, by the capacity-forming portions 543 to 546 formed between the IDT electrode 530 and the first and second surface acoustic wave elements 531 and 532, capacities to be directed onto the equalizing circuit can be adjusted in the surface acoustic wave elements 531 and 532 so as to cancel adverse effects caused by the parasitic capacities so that the amplitude balance and the phase balance can be improved. For this reason, electric characteristics of the surface acoustic wave apparatus 5 can be improved by the capacity-forming portions 543 to 546. Moreover, by appropriately selecting capacities of the capacity-forming portions 543 to 546 and inductances due to the pillar-shaped electrode and the conductor patterns 533 to 538, the attenuation outside the pass band of the surface acoustic wave apparatus 5 can be increased, and the electric characteristics of the surface acoustic wave apparatus 5 can be improved.

Moreover, by designing the wiring of the conductor patterns 533 to 538 that mutually connect the IDT electrodes 520 to 525 and 530 in a manner as shown in FIG. 6, even in the case where one of each pair of comb-shaped electrodes forming the IDT electrodes 520 to 525, located on the step gap side, is earthed, the corresponding comb-shaped electrode can be positively connected to connection lines 574 and 575 used for connection to external circuits so as to be positively drawn out of the protective cover. For this reason, even in the case where a plurality of IDT electrodes 520 to 525 and 530 are sealed by a single protective cover, since the connection to external circuits is positively ensured, the area of the surface acoustic wave element 592 can be greatly reduced in comparison with the structure in which each of the IDT electrodes 520 to 525 and 530 is covered by a protective cover individually. Moreover, since the connection to external circuits is ensured with the vibration space being sealed, it becomes possible to provide a surface acoustic wave apparatus 5 that is free from degradation of electric characteristics.

{Formation of Conductor Pattern}

Figure 7:
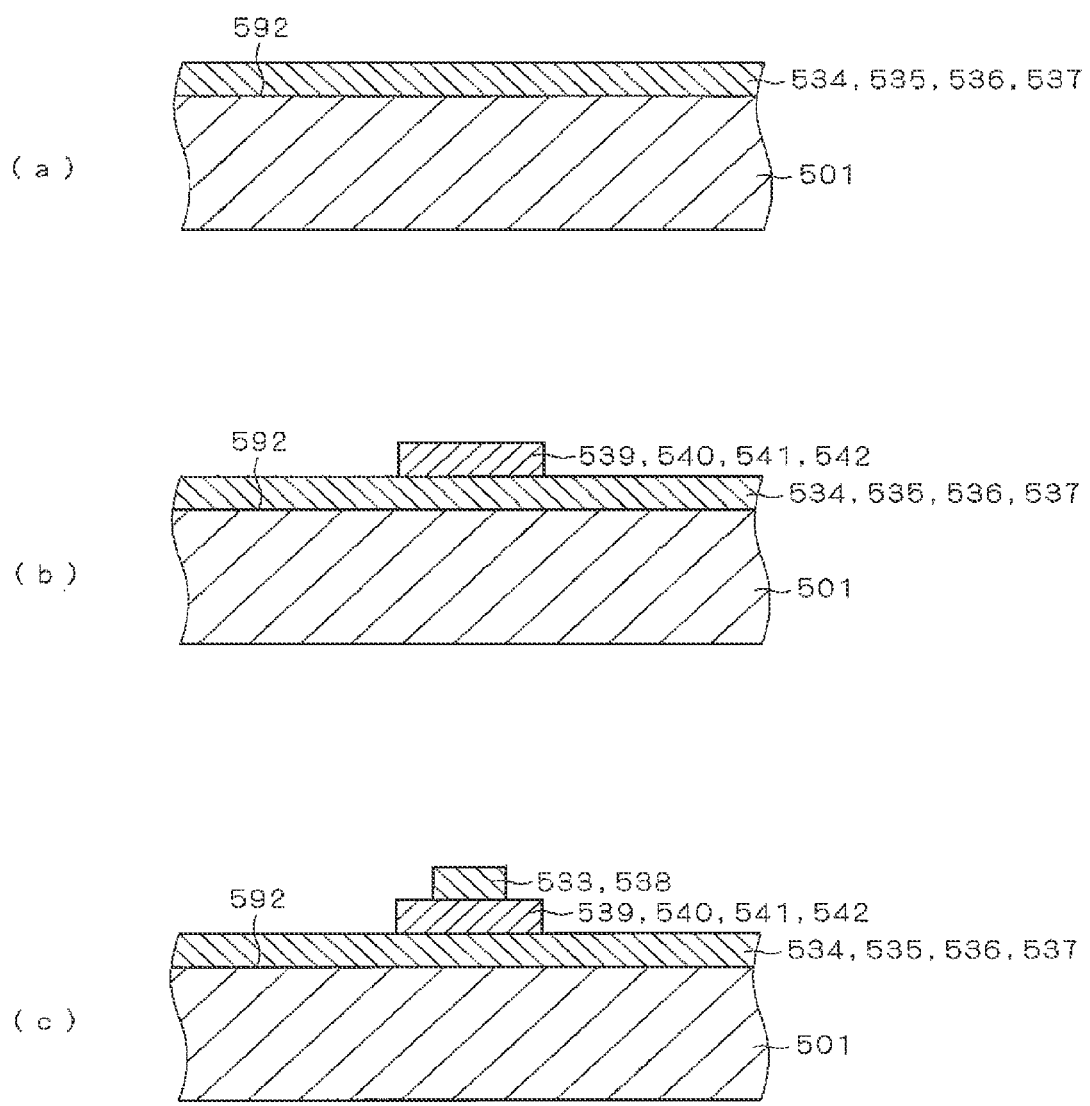
FIG. 7 is a view describing a forming method for a conductor pattern.

FIG. 7 is an explanatory view describing a method for forming the conductor patterns 533 to 538. FIGS. 7(a) and 7(b) are cross-sectional views showing conductor-pattern intersecting portions during the formation thereof, and FIG. 7(c) is a cross-sectional view showing each of the conductor pattern intersecting portions after the formation. FIGS. 7(a) to 7(c) are schematic views that help to improve understanding of the positional relationship among the respective parts of each of the conductor pattern intersecting portions.

Upon forming the conductor patterns, first, simultaneously as connection lines 571 to 575 are formed in the IDT electrode-forming process, as shown in FIG. 7(a), second conductor patterns 534 to 537, located on lower portions thereof, are formed. Next, as shown in FIG. 7(b), a film is formed on a surface acoustic wave element area 592 by using silicon oxide, polyimide resin, BCB-based resin, SOG (Spin On Grass), or the like, as an insulating material, through a spin coating method, and this is subjected to a normal etching process, and is consequently patterned to be formed into insulating layers 539 to 542. Next, as shown in FIG. 7(c), first conductor patterns 533 and 538 are formed in a manner so as to bridge over the insulating layers 539 to 542. Here, the first conductor patterns 533 and 538 and the second conductor patterns 534 to 537 can be formed by using the same materials as those of connection line 103 described above through the same method. Among the above-mentioned materials for the insulating layers 539 to 542, silicon oxide and polyimide resin are stable even under a temperature of 300.degree. C. or more. For this reason, when one of these is used for the material for the insulating layers 539 to 542, a stable electrically insulated state can be maintained between the first conductor patterns 533, 538 and the second conductor patterns 534 to 537 even in the case where the surface acoustic wave apparatus 5 is packaged at a high temperature, it becomes possible to preferably provide a surface acoustic wave apparatus 5 having high reliability.

Sixth Embodiment

A sixth embodiment relates to a method for manufacturing a surface acoustic wave apparatus.

FIG. 8 is a view describing the method for manufacturing a surface acoustic wave apparatus in accordance with the sixth embodiment. FIG. 8(a) is a cross-sectional view of a work in process for the surface acoustic wave apparatus 4, and FIG. 8(b) is a cross-sectional view of the surface acoustic wave apparatus 4. FIGS. 8(a) and 8(b) are schematic views that help to improve understanding of the positional relationship among the respective parts of the work in process for the surface acoustic wave apparatus 4, or the surface acoustic wave apparatus 4.

In the method for manufacturing a surface acoustic wave apparatus in accordance with the sixth embodiment, first, as shown in FIG. 8(a), a plurality of surface acoustic wave element areas 192 are formed on one sheet of wafer-shaped piezoelectric substrate 101 through processes that are the same as those of the method for manufacturing a surface acoustic wave apparatus of the first embodiment and those of the method for forming electrodes of the fourth embodiment. Next, as shown in FIG. 8(b), the piezoelectric substrate 101 is divided into the respective surface acoustic wave element areas 192 so that a plurality of surface acoustic wave apparatuses 1 are formed. Thus, a plurality of WLP-type surface acoustic wave apparatuses 4 are simultaneously formed, and it becomes possible to eliminate the necessity of conventional processes, such as preparing packages (protective cases) for the respective surface acoustic wave apparatuses, and individually assembling the surface acoustic wave apparatuses that have been formed into chips through a dicing process. For this reason, assembling devices, such as a die bonder and a seam welding machine having small processing capabilities, are no longer required, and the manufacturing processes are consequently simplified greatly so that the mass productivity can be improved.

Here, the process for providing these separated surface acoustic wave element areas 191 is preferably carried out as the last process for the manufacturing processes of the surface acoustic wave apparatus 4. With this arrangement, a plurality of surface acoustic wave apparatuses 4 capable of being surface-packaged can be obtained, upon separations of the respective surface acoustic wave element areas 192 individually.

Moreover, when a plurality of surface acoustic wave element areas 192 are formed on a piezoelectric substrate 101, a protective cover 117 forming a portion having a difference in level is isolated, at the time of a forming process of the lid member 107, with the other faces being formed into faces without a difference in level. For this reason, in the process for forming a plating base layer 408, the plating base layer 408 located at a position on which a pillar-shaped electrode 410 is to be formed, is made to connect to all the surface acoustic wave element areas 192 formed on the piezoelectric substrate 101. As a result, the pillar-shaped electrode 410 can be positively laminated on each of the entire surface acoustic wave element areas 192 so that the productivity can be improved.

In accordance with the method for manufacturing a surface acoustic wave apparatus of the sixth embodiment, it becomes possible to achieve a surface acoustic wave apparatus 4 having a small size with a shortened height, and also to realize a surface acoustic wave apparatus 4 having high reliability with superior shock resistance.

Others

The present invention is not intended to be limited by the above-mentioned embodiments, and it is understood that numerous other modifications and variations can be devised without departing from the scope of the invention.

For example, the embodiments have been exemplified by a structure in which a single protective cover is installed in a single surface acoustic wave apparatus; however, a plurality of protective covers may be installed in a single surface acoustic wave apparatus. For example, in the surface acoustic wave area 592 shown in FIG. 6, protective covers may be prepared as separate ones depending on the IDT electrode 530 and the surface acoustic wave elements 31 and 32.

The invention claimed is:

1. A method for manufacturing a surface acoustic wave apparatus comprising the steps of:
    a) forming an interdigital transducer (IDT) electrode and a connection line on an upper surface of a piezoelectric substrate, the IDT electrode being formed in a formation area on the piezoelectric substrate, the connection line for connecting the IDT electrode to an external circuit located outside of the surface acoustic wave device;
    b) forming a protective film after step a) and before step c), the protective film covering the formation area and at least an area where a frame member is to be disposed;
    c) forming the frame member on an upper surface of said protective film, the frame member surrounding the formation area and the frame member overlapping said connection line with the protective film between the frame member and the connection line in a thickness direction of the piezoelectric substrate; and
    d) forming a protective cover which is composed of said frame member and a lid member that covers said formation area and is configured for forming a space by connecting said lid member on said frame member, at least one of said frame member and said lid member being composed of resin, wherein one portion of the connection line is drawn outside the space.

2. The method for manufacturing a surface acoustic wave apparatus according to claim 1, wherein said step c) includes the steps of:
    c-1) mounting a first film on said piezoelectric substrate; and
    c-2) forming said frame member by curing said first film after patterning said first film by a photolithography method.

3. The method for manufacturing a surface acoustic wave apparatus according to claim 2, wherein said frame member and said lid member are made of the same material.

4. The method for manufacturing a surface acoustic wave apparatus according to claim 1, wherein said step c) includes the steps of:
    c-1) mounting a second film including a resin layer and a holding layer having a higher Young's modulus than that of said resin layer on an upper surface of said frame member with said holding layer being placed on an upper side of the resin layer;
    c-2) forming said lid member by curing said second film after patterning said second film by a photolithography method; and
    c-3) removing said holding layer of said second film after joining said frame member and said lid member together.

5. The method for manufacturing a surface acoustic wave apparatus according to claim 1, further comprising the protective film is made of an insulating material.

6. The method for manufacturing a surface acoustic wave apparatus according to claim 1, wherein one portion of said connection line is extended outside said frame member.

7. The method for manufacturing a surface acoustic wave apparatus according to claim 6, further comprising the steps of:
    e) forming a plating base layer that covers said piezoelectric substrate having a sheet of wafer shape on which said protective cover has been formed;
    f) forming a plating resist film having an opening section on said connection line located outside said protective cover on said plating base layer;
    g) forming a pillar-shaped electrode on said plating base layer exposed to a bottom of said opening section by using a plating method;
    h) removing said plating resist film and said plating base layer, with said pillar-shaped electrode being left;
    i) forming a sealing resin film covering said protective cover and said pillar-shaped electrode on said piezoelectric substrate; and
    j) exposing said pillar-shaped electrode by grinding an upper surface of said sealing resin film.

8. The method for manufacturing a surface acoustic wave apparatus according to claim 7, further comprising the steps of:
    l) forming a protective layer made from a material having virtually the same thermal expansion coefficient as that of said sealing resin film on a lower surface of said piezoelectric substrate.

9. The method for manufacturing a surface acoustic wave apparatus according to claim 7, wherein after said step j), a height of the uppermost portion of said pillar-shaped electrode is made higher than a height of the uppermost portion of said protective cover.

10. The method for manufacturing a surface acoustic wave apparatus according to claim 7, wherein in said step f), said plating resist film is formed by repeating coating and curing processes of a resist material a plurality of times.

11. The method for manufacturing a surface acoustic wave apparatus according to claim 6, wherein, said surface acoustic wave apparatus comprises a plurality of said IDT electrodes and further comprises a plurality of conductor patterns connected to said IDT electrodes, wherein each of said conductor patterns includes: a first conductor pattern; an insulating layer; and a second conductor pattern that intersects with said first conductor pattern, with said insulating layer being interposed therebetween.

12. The method for manufacturing a surface acoustic wave apparatus according to claim 11, wherein said insulating layer is made of silicon oxide or a polyimide resin.

13. The method for manufacturing a surface acoustic wave apparatus according to claim 1, wherein, a plurality of surface acoustic wave element areas including said IDT electrode are formed on said piezoelectric substrate having a sheet of wafer shape, said method further comprising the step of:
    m) forming a plurality of surface acoustic wave apparatuses by separating said piezoelectric substrate into said respective surface acoustic wave element areas.

14. The method for manufacturing a surface acoustic wave apparatus according to claim 1, further comprising the step of:
    n) forming a conductive material on a lower surface of said piezoelectric substrate.

15. The method for manufacturing a surface acoustic wave apparatus according to claim 1, further comprising the step of:
    o) connecting said connection line to the external circuit through a through hole passing through said frame member and said lid member.

16. The method for manufacturing a surface acoustic wave apparatus according to claim 1, further comprising the step of:

p) forming a protective portion on a lower surface of said piezoelectric substrate.

17. The method for manufacturing a surface acoustic wave apparatus according to claim 1, further comprising the step of:

q) forming conductor-pattern intersecting portions, at which a plurality of conductor patterns connected to said IDT electrode sterically intersect with one another, in the formation area, wherein in said step d) after said step q), said IDT electrode and said conductor-pattern intersecting portions are housed in the space.

\* \* \* \* \*